United States Patent
Otremba et al.

(10) Patent No.: US 10,224,912 B2
(45) Date of Patent: Mar. 5, 2019

(54) HALF BRIDGE CIRCUIT, METHOD OF OPERATING A HALF BRIDGE CIRCUIT AND A HALF BRIDGE CIRCUIT PACKAGE

(71) Applicant: Infineon Technologies Austria AG, Villach (AT)

(72) Inventors: Ralf Otremba, Kaufbeuren (DE); Josef Hoeglauer, Heimstetten (DE); Gerhard Noebauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/477,415

(22) Filed: Apr. 3, 2017

(65) Prior Publication Data
US 2017/0288654 A1    Oct. 5, 2017

(30) Foreign Application Priority Data

Apr. 4, 2016 (DE) .................. 10 2016 106 113

(51) Int. Cl.
*H03K 5/08* (2006.01)
*H01L 23/00* (2006.01)
(Continued)

(52) U.S. Cl.
CPC .............. *H03K 5/08* (2013.01); *H01L 24/05* (2013.01); *H01L 24/45* (2013.01);
(Continued)

(58) Field of Classification Search
CPC ........ H03K 5/08; H03K 17/567; H01L 24/45; H01L 24/05; H01L 2224/45664;
(Continued)

(56) References Cited

U.S. PATENT DOCUMENTS 6,373,705 B1 * 4/2002 Koelle .................... H01L 23/36
165/104.33
8,947,898 B2 * 2/2015 Nakamura ............ H02M 7/537
363/131

(Continued)

FOREIGN PATENT DOCUMENTS

DE         19900603 A1    7/2000
DE      102004036905 A1    3/2006

OTHER PUBLICATIONS

"LCS700-708 HiperLCS Family—Integrated LLC Controller, High-Voltage Power MOSFETs and Drivers", Power Integrations, Rev. F Jun. 2015, pp. 1-30.

*Primary Examiner* — Jung Kim
(74) *Attorney, Agent, or Firm* — Murphy, Bilak & Homiller, PLLC

(57) ABSTRACT

A half bridge circuit includes an input connection configured to supply an electric input, an output connection configured to supply an electric output to a load to be connected to the output connection, a switch and a diode arranged between the input connection and the output connection and a voltage limiting inductance arranged in series between the switch and the diode. The voltage limiting inductance is configured to limit, upon switching the switch, a maximum voltage across the switch to below a breakdown voltage of the switch. A corresponding method of operating the half bridge circuit and package are also described.

17 Claims, 8 Drawing Sheets

(51) Int. Cl.
 *H03K 17/567* (2006.01)
 *H03K 17/0814* (2006.01)

(52) U.S. Cl.
 CPC ..... *H03K 17/08142* (2013.01); *H03K 17/567* (2013.01); *H01L 2224/04042* (2013.01); *H01L 2224/45639* (2013.01); *H01L 2224/45644* (2013.01); *H01L 2224/45655* (2013.01); *H01L 2224/45664* (2013.01)

(58) Field of Classification Search
 CPC . H01L 2224/45655; H01L 2224/45644; H01L 2224/45639; H01L 2224/04042
 See application file for complete search history.

(56) References Cited

U.S. PATENT DOCUMENTS

2011/0095409 A1    4/2011    Kue et al.
2014/0063744 A1    3/2014    Lopez et al.
2014/0306332 A1    10/2014    Denison et al.

\* cited by examiner

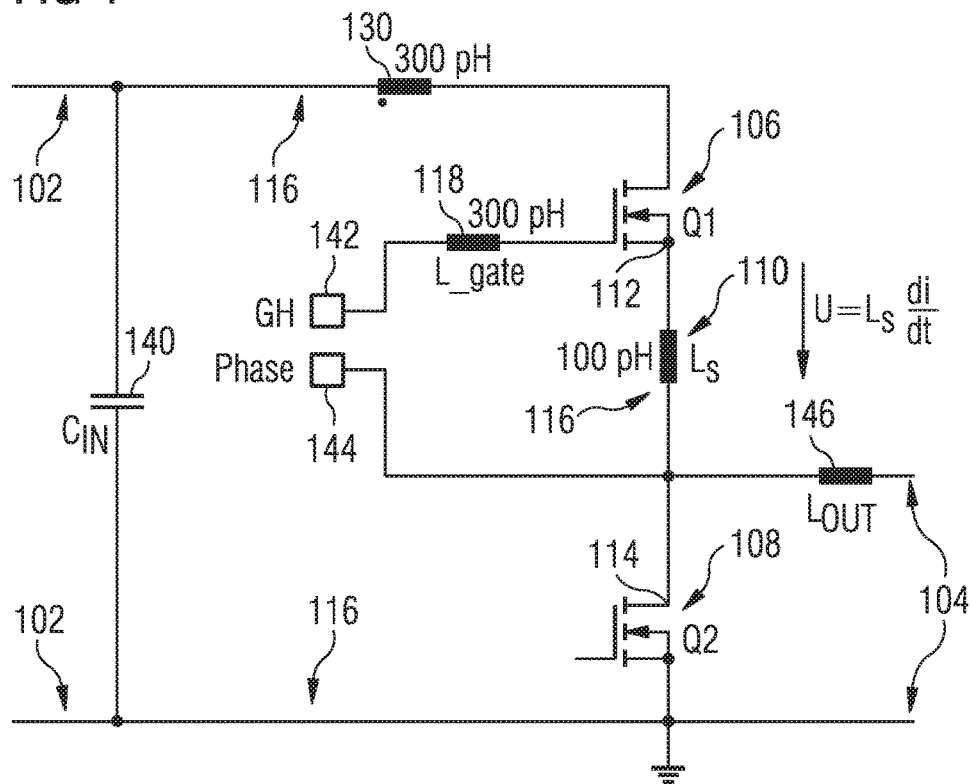
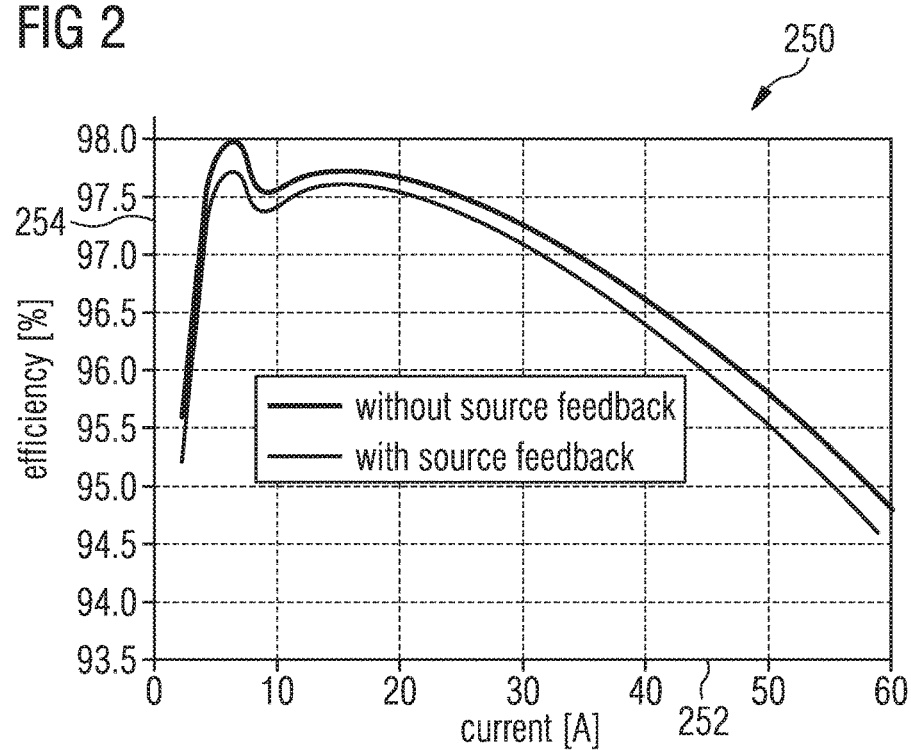

HALF BRIDGE CIRCUIT, METHOD OF OPERATING A HALF BRIDGE CIRCUIT AND A HALF BRIDGE CIRCUIT PACKAGE

TECHNICAL FIELD

The present invention relates to a half bridge circuit, a method of operating a half bridge circuit, and a package.

BACKGROUND

A buck converter (step-down converter) is a DC-to-DC power converter which steps down voltage (while stepping up current) from its input (supply) to its output (load). It typically contains at least two semiconductors (a diode and a transistor, although modern buck converters frequently replace the diode with a second transistor used for synchronous rectification) and at least one energy storage element (such as a capacitor, inductor, or the two in combination). To reduce voltage ripple, filters made of capacitors (sometimes in combination with inductors) may be added to such a converter's output (load-side filter) and input (supply-side filter).

The requirement profile of high performance synchronous buck converters demands high conversion efficiency over the entire load range. In order to achieve this, various measures need to be taken to reach proper behavior. As one of the requirements for proper efficiency, the FETs need to be switched as fast as possible. However, extremely fast switching may lead to voltage overshoots which might be out of the safe operating area of the device, i.e. the device may enter avalanche.

SUMMARY

There may be a need for a half bridge circuit and a package with a proper performance and a high reliability during operation.

According to an exemplary embodiment, a half bridge circuit is provided which comprises an input connection for supplying an electric input (such as an input voltage), an output connection for supplying an electric output (such as an output current) (for instance to a load to be connected to the output connection), a switch and a diode between the input connection and the output connection, and a voltage limiting inductance designed (in particular dimensioned) and arranged between the switch and the diode and configured for limiting a voltage upon switching the switch (in particular when switching the switch from an "on" state into an "off" state).

According to another exemplary embodiment, a method of operating a half bridge circuit is provided, wherein the method comprises supplying an electric input to an input connection, generating an electric output by a switch and a diode between the input connection and an output connection to which a load is connected, and limiting a voltage occurring upon switching the switch by a voltage limiting inductance arranged between the switch and the diode.

According to yet another exemplary embodiment, a package is provided which comprises a packaging clip and a wire, wherein the wire is connected to the clip (in particular is connected to an upper main surface of the clip).

According to one aspect of exemplary embodiments, a voltage limiting inductance between a switch and a diode of a half bridge circuit is designed so that when the switch is switched rapidly during operation of the half bridge circuit (in particular when the switch is switched off), a voltage overshoot which may conventionally bring the switch up to or even above its breakdown voltage can be maintained sufficiently small so that the functionality of the half bridge circuit is not disturbed. In particular, the design may be such that the voltage overshoot upon switching the switch may be kept so small that it always remains reliably below the breakdown voltage. More specifically, the design of the voltage limiting inductance may be such that the overshoot voltage is limited reliably below the breakdown voltage and at the same time does not excessively limit performance of the half bridge circuit.

According to another aspect of exemplary embodiments, an electrically conductive clip which is conventionally used to directly electrically contact a semiconductor chip on a mounting base such as a lead frame may be directly connected with one or more electrically conductive wires which may electrically couple a dedicated surface portion of the clip within an electronic member, for instance with a semiconductor chip of a corresponding package. Thus, the functionality of a clip can be extended so that it can contribute to a bond wire based electric coupling in addition to the direct electric coupling function of the clip. Such an architecture allows to sate space and provides a high degree of flexibility to a circuit designer.

The above and other objects, features and advantages of the present invention will become apparent from the following description and the appended claims, taken in conjunction with the accompanying drawings, in which like parts or elements are denoted by like reference numbers.

Those skilled in the art will recognize additional features and advantages upon reading the following detailed description, and upon viewing the accompanying drawings.

BRIEF DESCRIPTION OF THE DRAWINGS

The accompanying drawings, which are included to provide a further understanding of exemplary embodiments of the invention and constitute a part of the specification, illustrate exemplary embodiments of the invention. The illustrations in the drawings are not to scale.

In the drawings:

FIG. 1 illustrates a circuit diagram of a buck converter with a half bridge according to an exemplary embodiment;

FIG. 2 is a diagram illustrating conversion efficiency of a conventional half bridge and of a half bridge according to an exemplary embodiment depending on a current;

DETAILED DESCRIPTION

Figure 3:
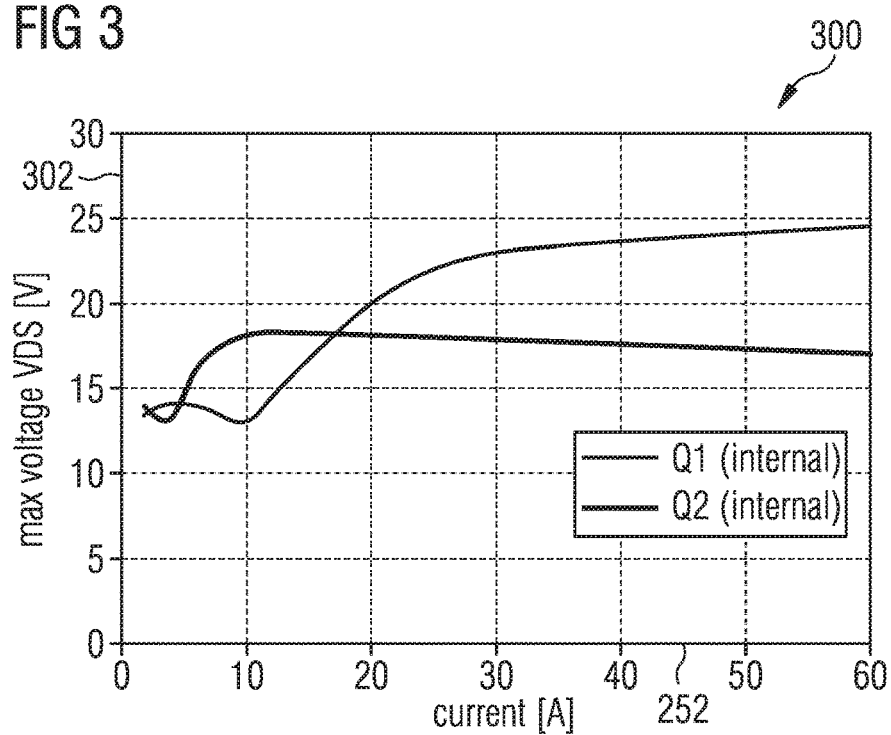
FIG. 3 is a diagram illustrating maximum voltage of different transistors of a half bridge according to an exemplary embodiment depending on a current.

In the context of the present application, the term "voltage limiting inductance" may particularly denote an inductance located spatially directly between switch and diode. Such a voltage limiting inductance may be a lumped element or may be a correspondingly and intentionally defined and designed parasitic inductance in the mentioned spatial range.

In the context of the present application, the term "clip" may particularly denote a solid electrically conductive structure (in particular made of copper) which may be embodied as a (for instance bent and/or patterned) sheet and which may be configured for contacting a surface of a semiconductor chip from above. Clip-bonding technology is an alternative to wire-bond connection between semiconductor chip and lead by a solid metal bridge (in particular copper bridge). Such a clip may be connected to the semiconductor chip by soldering using solder paste. A clip may be a three-dimensionally bent structure being capable of covering an upper main surface of a semiconductor chip with a first surface portion of the clip and of covering a surface portion of a carrier (for instance a chip carrier, such as a lead frame, on which the semiconductor chip is mounted) on which the clip is supported at the same time. When assembled with carrier and semiconductor chip, the clip pushes onto the semiconductor chip from above. A clip may comprise a top plate portion, a bottom connection portion and a vertical transient portion in between.

In the following, further exemplary embodiments of the half bridge circuit, the method, and the package will be explained.

In an embodiment, the switch is configured as a transistor switch, in particular a field effect transistor switch. Such a transistor switch may form a highside switch.

In an embodiment, the diode is configured as a transistor diode, in particular a field effect transistor diode. Such a transistor diode may form a lowside switch.

In an embodiment, the voltage limiting inductance is arranged between a source of the transistor switch and a drain of the transistor diode. This location of the voltage limiting inductance has turned out as highly efficient for reducing overshoots in buck converters designs based on a half bridge. With a correspondingly positioned voltage limiting inductance, it is possible to create a feedback using source inductance to reduce gate current.

In an embodiment, the voltage limiting inductance has an inductance value being large enough so that the voltage upon switching the switch remains below a breakdown voltage of the switch. In an embodiment, this voltage may be limited to less than 30 V, in particular is limited to not more than 25 V. By taking this measure, it can be prevented that the voltage at the switch reaches or even exceeds the breakdown voltage, which might deteriorate the half bridge circuit.

In an embodiment, the voltage limiting inductance has an inductance value of at least 50 pH, in particular of at least 80 pH, more particularly of at least 100 pH. When the voltage limiting inductance is a parasitic inductance rather than a lumped element, connection between source of switch and drain of diode can be defined to obtain the mentioned values of the inductance. For example, this may be achieved by configuring the connection between source of switch and drain of diode by a clip.

In an embodiment, the half bridge circuit comprises a loop between the input connection and the output connection and including both the switch and the diode. A proper design of this loop has turned out as an efficient measure for suppressing voltage overshoots during switching of the half bridge.

In an embodiment, an inductance value of the voltage limiting inductance is at least 20%, in particular in a range between 20% and 70%, of a loop inductance of the loop. A percentage about 20% has turned out to be particularly effective for a sufficient reduction of voltage overshoot during switching. A percentage below 70% has turned out to be particularly advantageous, because a slight conversion efficiency reduction of the half bridge caused by the voltage limiting inductance can then be kept very small.

In an embodiment, an inductance value of a gate inductance of the transistor switch is below 1 nH, in particular is not more than 500 pH. While a relatively high voltage limiting inductance has turned out to be advantageous to suppress overshoots, this effect can be further strengthened by simultaneously keeping the gate inductance of the switch sufficiently low.

In an embodiment, the half bridge circuit is configured for bypassing the voltage limiting inductance in a certain condition or operation state of the half bridge circuit. For instance, such a bypassing may be done when the switch is switched from an "off" state into an "on" state in which case issues of overshoot are less severe compared to switching the switch from "on" state into an "off" state. Another occasion for activating bypassing is the event of determining that an electric current value in the half bridge circuit is below a predefined threshold value, in particular is below 20 A. As mentioned above, introducing the voltage limiting induction may slightly deteriorate the conversion efficiency of the half bridge. In order to limit this slight reduction of the efficiency to cases, in which the presence of a sufficiently high voltage limiting inductance is necessary (in particular a high current range), the voltage limiting inductance can be removed from the current flow path when overshoot protection is not necessary or is not desired (in particular in a low current range).

In an embodiment, the half bridge circuit is configured as a semiconductor package. In the context of the present application, the term "package" may particularly denote at least one at least partially encapsulated or surface mounted semiconductor chip with at least one external electric contact (such as a pad). The semiconductor chip may comprise at least one integrated circuit element (such as a diode or a transistor) in a surface portion thereof. The semiconductor chip may be a naked die or may be already packaged or encapsulated. Such a semiconductor chip may be embedded in the interior of the encapsulant, or may be surface mounted thereon.

In an embodiment, the switch and the diode belong to a common package. In particular, the switch and the diode may be mounted on the same mounting base, in particular on the same lead frame. It is also possible that the switch and the diode are electrically connected to one another by a bridging clip.

In an embodiment, the half bridge circuit is configured as buck converter circuit. In addition to a half bridge circuit (which may have alternatingly switched transistors), a converter circuit may additionally comprise one or more further electronic members (in particular at least one additional passive electronic member).

In an embodiment, the half bridge circuit further comprises a clip configured for coupling the switch with the diode. Such a clip may be made of a metallic sheet such as a copper sheet. Clip coupling rather than coupling by bond wires only has turned out as a powerful mechanism of adjusting the voltage limiting inductance to provide an overshoot protection.

In an embodiment, at least part of the voltage limiting inductance forms at least part of the clip. The clip may have further portions, but one clip portion may define the value of the voltage limiting inductance by bridging the source of the switch with the drain of the diode. As an alternative to a clip section or the entire clip, it is possible that the voltage limiting inductance is formed by one or more wires.

In an embodiment, the switch is configured as a first semiconductor chip, the diode is configured as a second semiconductor chip, and the clip covers at least part of the first semiconductor chip and the second semiconductor chip. A semiconductor chip may be a piece of semiconductor (such as a piece of silicon) having an active region in which one or more integrated circuit elements (such as a transistor or a diode) may be monolithically formed.

In an embodiment, the half bridge circuit further comprises at least one wire bridging a gap between the clip and a semiconductor chip, in particular a driver of the half bridge circuit. Thus, the combination of one or more bond wires and one or more clips provides a circuit designer with powerful tools for designing the voltage limiting inductance and further circuit properties.

Figure 10:
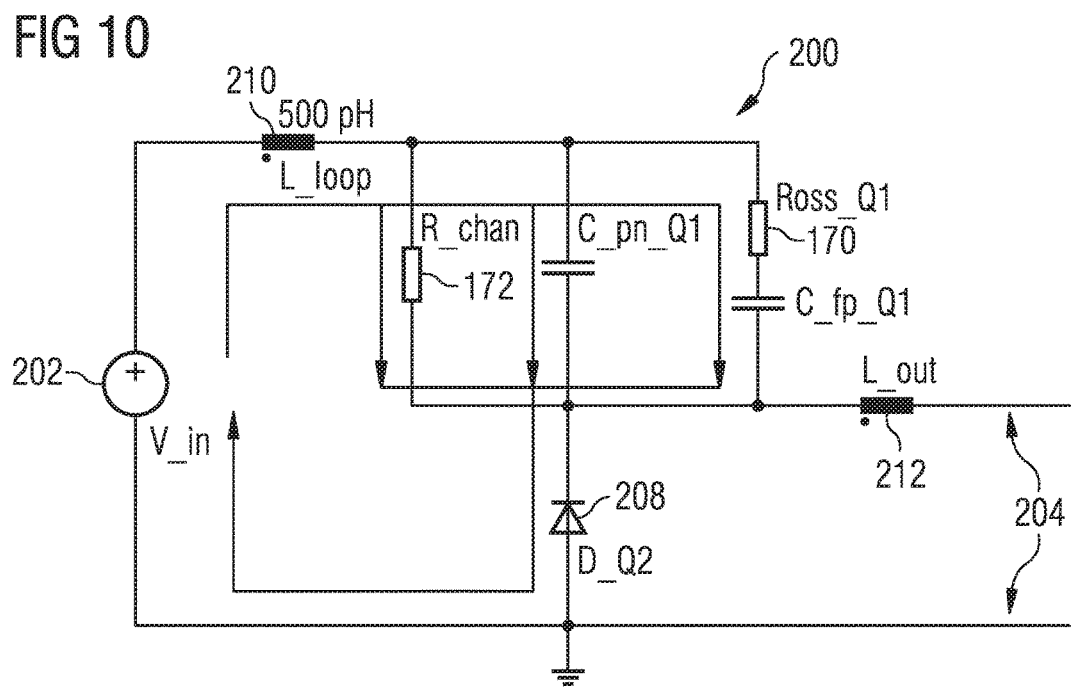
FIG. 10 illustrates a circuit diagram of a buck converter with a half bridge, and including elements (in particular R_chan, Ross_Q1) which may be implemented in the half bridge circuit according to FIG. 1.

In an embodiment, the clip comprises a first section, in particular a plate-type section, carrying a load current and comprises a second section, in particular a finger-type section, being electrically connected with the first section, but not carrying the load current during operation of the half bridge circuit. In other words, a main area of the clip may be arranged so that the main current can flow over the main area. Apart from this, a finger of the clip may be arranged and dimensioned to be prevented from carrying a significant amount of the load current. For example, only a gate charging current can be enabled to flow over the finger portion. It is possible that such a finger portion is not on source potential of the switch, In an embodiment, the half-bridge circuit furthermore comprises an energy dissipating ohmic resistor in series with the switch. Such an energy dissipating ohmic resistor can be connected to the switch and to the diode as shown in FIG. 10 (see reference numeral Ross_Q1). Such an energy dissipating ohmic resistor may dissipate excessive energy occurring during switching and can therefore contribute to a limitation of voltage overshoots.

In an embodiment, the half-bridge circuit furthermore comprises a charging suppressing ohmic resistor in parallel with the switch. Such a charging suppressing ohmic resistor can be connected to the switch and to the diode as shown in FIG. 10 (see reference numeral R_chan). Such a charging suppressing ohmic resistor may decelerate switching and can therefore also contribute to a limitation of voltage overshoots. In an embodiment, this resistor is not a physically existing element, but it is created by keeping the MOSFET channel slightly open to allow some current flow. For instance, a charging suppressing ohmic resistive path can be provided.

Figure 5:
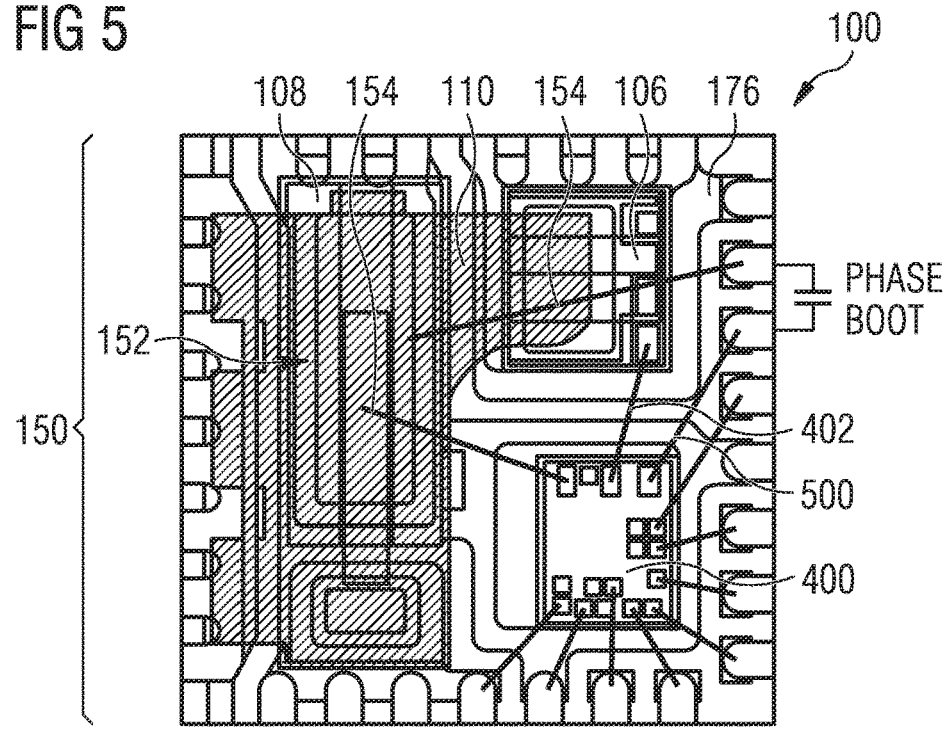
FIG. 5 and FIG. 6 illustrate plan views of packages of a buck converter with a half bridge, involving a bond wire connected clip, according to an exemplary embodiment.

In an embodiment, the half bridge circuit is configured so that, upon switching the switch "on" and upon switching the switch "off", the voltage limiting inductance is always inside a current flow path. Such an embodiment is shown in FIG. 5 and can be appropriate for a design involving MOSFETs with a low breakthrough voltage.

Figure 6:
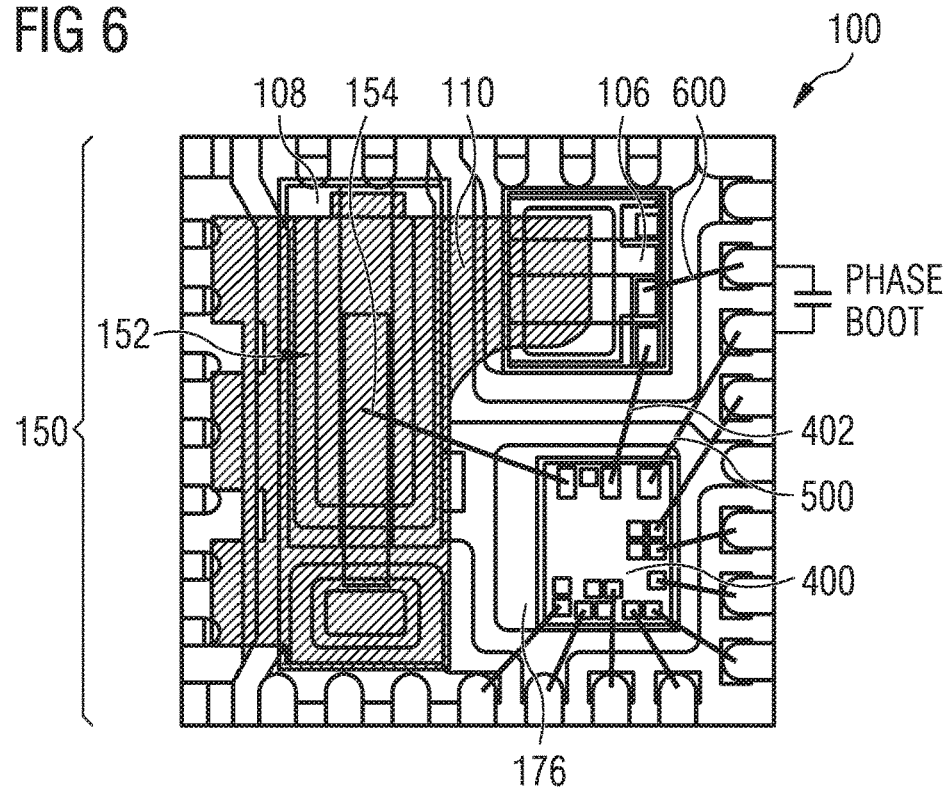

In another embodiment, the half bridge circuit is configured so that, upon switching the switch "on", the voltage limiting inductance is outside a current flow path, and upon switching the switch "off", the voltage limiting inductance is inside the current flow path. Such an embodiment is shown in FIG. 6 and can be appropriate when a maximum performance is desired, since this embodiment allows in the less critical "switch on" configuration that the half bridge circuit operates without the influence of the voltage limiting inductance.

In an embodiment, the voltage limiting inductance is configured as an inductive feedback element configured for limiting a gate current of the switch in the event of a rapidly changing electric current in the half bridge circuit. Based on this principle, voltage overshoots in particular when switching the switch off can be efficiently suppressed. This may result in a more reliably operating half bridge circuit.

In an embodiment, the package with the wire on clip configuration further comprises at least one semiconductor chip. The latter semiconductor chip may be electrically coupled with the clip via the wire. One end of the wire may be immobilized on an upper main surface of the clip, whereas the other end of the wire may be immobilized on a pad of the semiconductor chip.

In an embodiment, at least one other semiconductor chip is directly (i.e. without wire) electrically coupled with the clip. Hence, the package may comprise multiple semiconductor chips, wherein one part thereof may be coupled directly with the clip, whereas another part thereof may be coupled with the clip indirectly via the wire. A direct coupling between clip and semiconductor chip may be accomplished by soldering.

In an embodiment, the wire is a bond wire. Thus, a hybrid wire bond-clip coupling in a semiconductor package may be achieved. This increases the freedom of design of a circuit designer.

In an embodiment, the clip comprises a plate-type section and at least one finger section integrally formed with the plate-type section. Therefore, different clip sections may be assigned different functions by a merely geometrical design. For instance, the fact that an electric current preferably flows along a path with low ohmic resistor can be used for defining current rich and current poor portions of the clip.

In an embodiment, the at least one finger section is an overhanging structure. Such an overhanging structure may either hang free spaced with regard to a mounting base (such as a lead frame) in a cantilever fashion, or may be supported by a support element (such as a support post) for preventing undesired bending of the overhanging finger (for instance when a force is applied during connecting a bond wire to the finger).

In an embodiment, the package comprises a carrier, in particular a lead frame, on which the clip is mounted. The carrier may form a mounting base on which the one or more semiconductor chips are mounted. The clip and the at least one wire are arranged on top of the semiconductor chips and provide the electric contacting from an upper surface side.

In an embodiment, at least a part of a surface of the clip is covered with a plating, in particular a plating comprising at least one of the group consisting of silver, gold, palladium, nickel, and nickel-phosphorous. Usually, a clip may be made of copper. However, copper has the tendency of being oxidized on a surface. Therefore, in order to establish a reliable electric connection with a wire, it may be necessary to clean or chemically treat an oxidized upper surface of the clip before wire bonding to remove the surface layer of copper oxide. However, when the copper clip is covered with a plating (or any other coating) which is not prone to be oxidized (which condition is fulfilled for the above given examples of plating materials), wirebonding on such a plating can be carried out directly and without pre-treatment.

In an embodiment, the wire comprises at least one material of the group consisting of silver, aluminum, gold, and copper. However, other materials are possible as well.

In an embodiment, the wire comprises at least one of the group consisting of a ball, a wedge, and a ribbon. Ball and wedge may define end portions of a bond wire. Apart from a filament-type bond wire shaped like a yarn, it is also possible to implement a ribbon type bond wire made of a flat strip of electrically conductive material.

In an embodiment, the package is configured as one of the group consisting of a DC/DC conversion package (such as a buck converter), and a motor drive package. For example, a half bridge may be provided with a driver for an engine control.

The above and other objects, features and advantages of the present invention will become apparent from the following description and the appended claims, taken in conjunction with the accompanying drawings, in which like parts or elements are denoted by like reference numbers.

An exemplary embodiment of the invention implements an inductive feedback element in an integrated power stage which may reduce the gate current in case of a fast change of a current over time. In particular, in combination with a low inductive gate circuit, this may limit the maximum source-drain voltage (VDS) across the switch to a desired value. Hence, a gist of an exemplary embodiment of the invention is to actively design a source inductance, for instance by one or more additional connections (such as an additional finger of a clip, correspondingly adapted bond wires in case of wire bonding, etc.). Creating a proper source inductance can also be done on the chip itself to create the necessary voltage drop. Also wire bonding of gate to source pad or to leadframe may be possible to realize the described technical functions.

According to exemplary embodiments, a multi-finger clip design is implemented to bring the potential from the drain of the diode to the surface of the switch (wherein the length of a corresponding cut defines the inductance value of the voltage limiting inductance). Such an additional clip finger may be in mechanical contact with a passivated surface (to facilitate wire bonding on the clip). The clip finger can be soldered on the die at a dedicated landing area (isolated from source of the FET), and a connection to the gate driver (phase wire) can be established by wire bonding on the chip surface. In particular, the source inductance may be realized by the clip, but the connection from drain of the flipped low side FET may be established by wire bonding.

Particularly advantageously is a design where the source inductance is a quarter or more of the overall loop inductance.

In an embodiment, the impact at turn-on and turn-off can be separated in case a bootstrap capacitor is connected to the switch. It is possible to design different source inductance values for turn-on and turn-off.

In an embodiment, it is possible to provide a source feedback for both transitions, where both the capacitor and the gate driver are connected in a way that the inductive effect is created. In another embodiment, such a feedback is provided for only the turn-off phase. In yet another configuration, feedback is activated for turn-on only (in such an embodiment, a driver may be connected directly to the FET).

It may be advantageous to have a fast gate loop, i.e. to have a low gate loop inductance for faster response. In this context it is possible that an NMOS of the output stage of the high side driver can be integrated in the switch. It may also be advantageous to provide a power stage with integrated NMOS in the high side switch, together with the above described source feedback loop design.

As the feedback is only needed for higher currents (for example at I≥20 A), it can be bypassed in one embodiment at lower currents to reach optimum efficiency.

According to an exemplary embodiment, a power stage may be provided with two connections, wherein the driver determines the current and uses the appropriate connection based on the result to optimize light load and peak efficiency.

Before describing exemplary embodiments of the invention referring to FIG. 1 to FIG. 6, FIG. 15 in further detail, several issues with conventional buck converters with half bridges, as identified by the present inventors, will be explained. Improved or optimized package design to reduce or minimize overshoots in buck converters according to exemplary embodiments of the invention will then be described thereafter.

An issue with buck converters based on half bridges is that fast switching may lead to voltage overshoots. This is particularly critical for the high side switch: When turning off the field effect transistor (FET), the energy stored in the magnetic field of the power loop will keep the current flowing which will charge up the output capacitance of the FET. In a conventional circuit, there is no effective bypass element which could take the energy. If the magnetic energy EM (given roughly as $EM=L*I^2/2$, wherein L is the inductance and I is the current) is bigger than the energy EC which the output capacitance can store ($EC=C*VDS^2/2$, wherein C is the capacitance), the voltage may reach the breakdown voltage. As the inductance cannot be reduced to zero, and load current values tend to go up, avalanche cases can be unavoidable for highly efficient buck converters.

Exemplary embodiments of the invention provide a solution which effectively reduces the voltage spikes of integrated buck converters (power stages) while keeping conversion efficiency at a high level.

Figure 7:
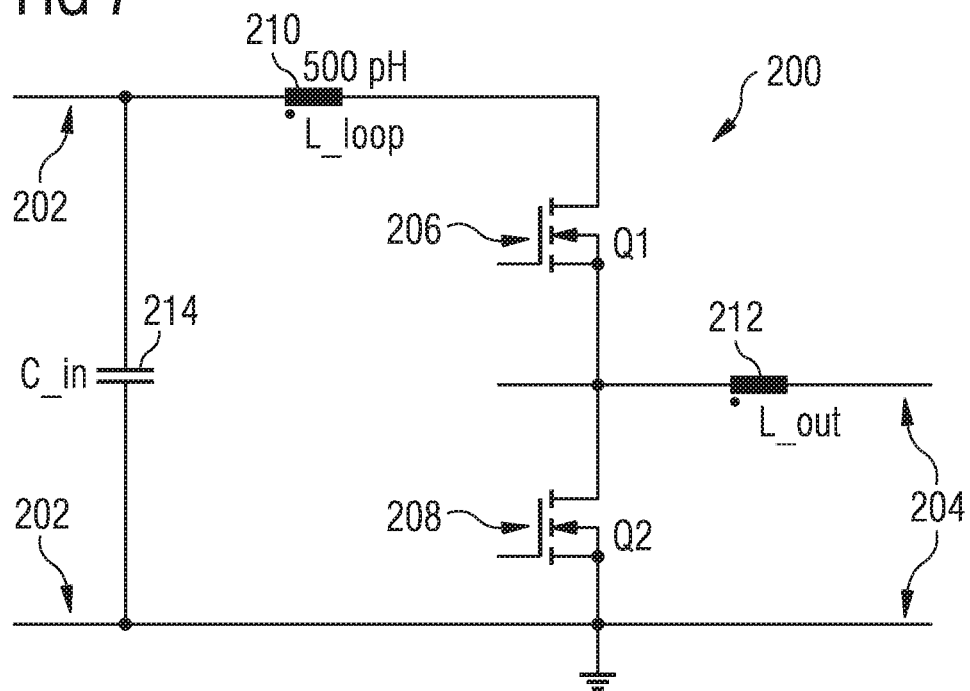
FIG. 7 and FIG. 8 illustrate circuit diagrams of a buck converter with a half bridge.
Figure 8:
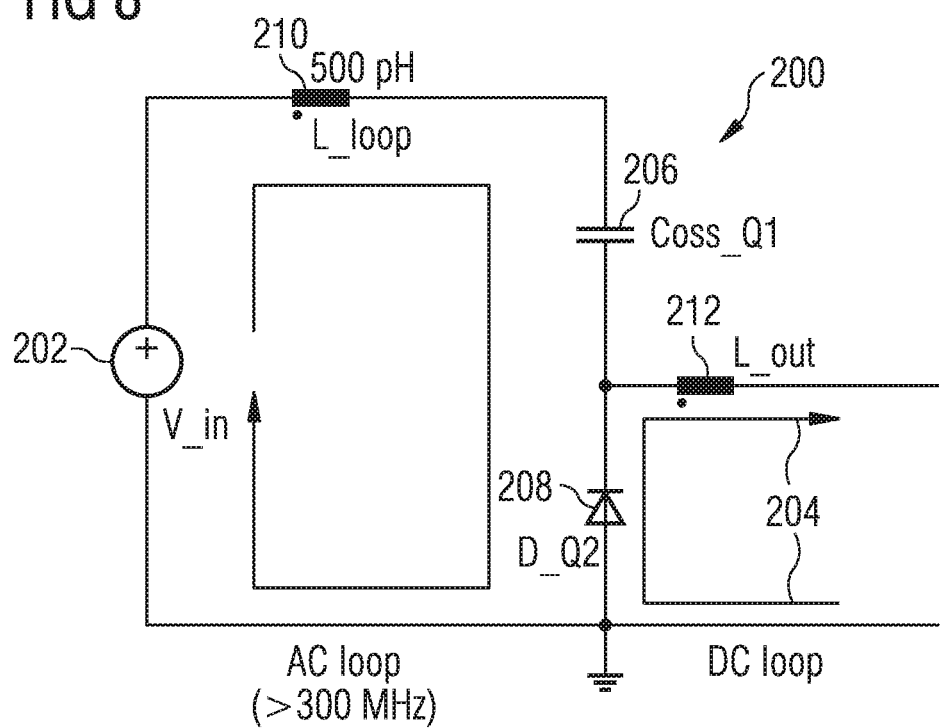

FIG. 7 and FIG. 8 illustrate circuit diagrams 200 of a buck converter with a half bridge.

Between an inlet 202 and an outlet 204, an arrangement of a transistor switch 206 and a transistor diode 208 is provided. An inlet capacitance 214, a loop inductance 210 and an outlet inductance 212 are present as well. As can be taken from FIG. 8, the left hand side part of circuit diagram 200 functions as AC loop, whereas the right hand side part of the circuit diagram 200 functions as a DC loop.

FIG. 7 and FIG. 8 hence show a circuit diagram 200 in which the two field effect transistors Q1, Q2 are circuited in half bridge configuration. Once Q1 is switched off in the circuit diagram 200 according to FIG. 7, this is equivalent to the simplified circuit diagram 200 of FIG. 8.

Figure 9:
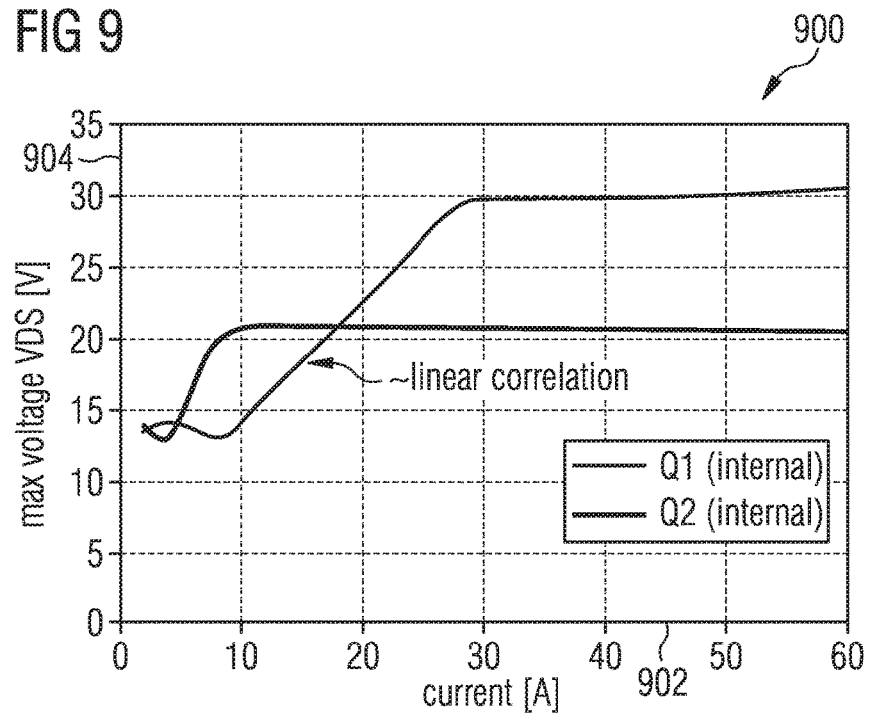
FIG. 9 is a diagram illustrating maximum voltage of different transistors of the half bridge according to FIG. 7 and FIG. 8.

FIG. 9 is a diagram 900 illustrating maximum voltage VDS of different transistors of the half bridge according to FIG. 7 and FIG. 8. Along an abscissa 902, the current is plotted. Along an ordinate 904, the maximum voltage is plotted. Hence, FIG. 9 shows that the simulated maximum voltage across Q1 reaches the breakdown voltage at approximately a load current value of 28 A in the given example.

It may be assumed that output current value Iout is positive, Q1 is an ideal switch (i.e. switching time is zero), and that capacitance Coss_Q1 of Q1 is charged from the loop inductance L_loop, i.e. a current source.

The energy EL stored in the loop inductance L_loop is:

$$EL = \tfrac{1}{2} L\_loop\, Iout^2$$

Once Q1 is switched off, the system will move to its new equilibrium. It is a damped nonlinear tank circuit and the energy is transferred to capacitive energy EC, i.e. in capacitance Coss_Q1 of Q1:

$$EC = \int_0^{VDS,max} U dQ = \int_0^{VDS,max} Coss\_Q1\; U dU$$

In the latter equation, U is the voltage and Q is the charge. VDS,max is reached if EL is fully transferred to EC, i.e. EC=EL. If the energy EL is too big, Q1 will avalanche. If the system was linear, the overshoot would be:

$$VDS,max = \sqrt{(L\_loop/Coss\_Q1)}\; Iout$$

FIG. 10 illustrates a circuit diagram 200 of a buck converter with a half bridge. Several elements of the circuit diagram 200 (in particular R_chan and/or Ross_Q1) can also be implemented in a half bridge circuit 100 according to an exemplary embodiment of the invention. Preferably, R_chan is embodied as the channel resistance, i.e. the FET is intentionally not turned off properly.

Strategies to avoid repetitive avalanche in the high side switch Q1 implemented in the circuit diagram 200 of FIG. 10 will be explained in the following.

One measure which can be taken for reducing the overshoot is the reduction of the loop inductance L_loop. However, this is only possible to a limited extent due to other circuit design constraints. A very low inductance may lead to large charging current, so the current in the first capacitor may be larger than 100 A.

Another measure which can be taken for reducing the overshoot is the increase of the capacitance of the switch C_oss_Q1. One possibility to achieve this is the use of a bigger die. However, when the die becomes too big, it may not fit into the package. Moreover, this approach involves additional volume. Beyond this, this may have a negative impact on the peak efficiency, but may improve the full load.

Yet another approach for reducing the overshoot voltage is to put a series resistor Ross_Q1 to dissipate the energy.

Another approach for reducing the overshoot voltage is to put a parallel resistor R_chan (preferably embodied as channel resistance) or current path to reduce the charging of the capacitance of the switch Coss_Q1. This keeps the channel open, or opens it again. It reduces the gate drive strength for higher currents and reduces the threshold voltage to slow turnoff. It is also possible to implement a Zener diode between gate and drain.

While the above-mentioned approaches (in particular the implementation of the above described series resistor and/or of the above-described parallel resistor) for limiting overshoot voltage may be implemented advantageously according to exemplary embodiments of the invention, these approaches are limited to a certain extent so that there is still room for improvement in terms of overshoot suppression.

According to an exemplary embodiment and as will be described below in further detail, it is possible to efficiently reduce overshoot voltage by creating a feedback using a source inductance to reduce a gate current (in particular when a small gate loop inductance is implemented).

Reducing the loop inductance is limited by the physical dimensions and pick-and-place limitations during the assembly process. Higher output capacitance Coss_Q1 helps, but to reach 60 A without avalanche in the used real-world example shown in FIG. 7 and FIG. 8, the output capacitance would need to be quadrupled, with negative effects on compactness, light load and peak efficiency.

Putting a resistor in series to a part of the output capacitance reduces the overshoot, but is of limited effect. In the given example, a value of more than about 1 Ohm shows a limited improvement (compare FIG. 12 described below). Compared to an Ross_Q1=0 Ohm design, the range without avalanche can be increased from 22 A to 30 A.

The penalty on efficiency is about 0.2%.

Figure 11:
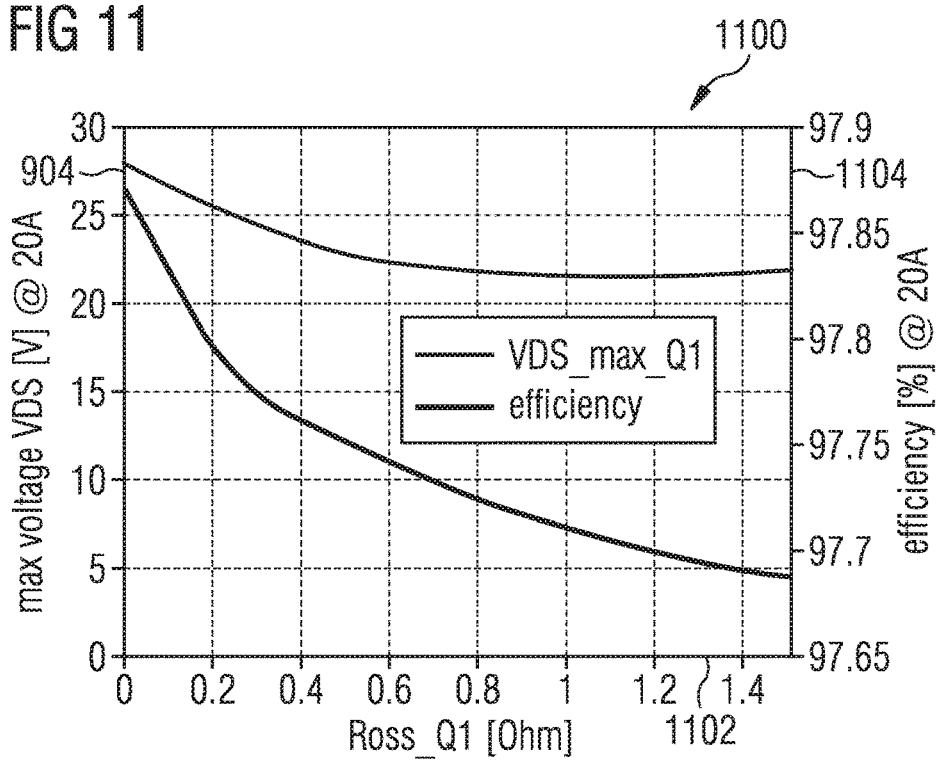
FIG. 11 is a diagram illustrating maximum voltage and illustrating efficiency of the half bridge according to FIG. 10 depending on a resistor value.

FIG. 11 is a diagram 1100 illustrating maximum voltage and efficiency of the half bridge according to FIG. 10 depending on a resistor value. Along an abscissa 1102, the value of the resistor Ross_Q1 is plotted. Along an ordinate 904, the maximum voltage is plotted. Along an ordinate 1104, the efficiency is plotted.

Figure 12:
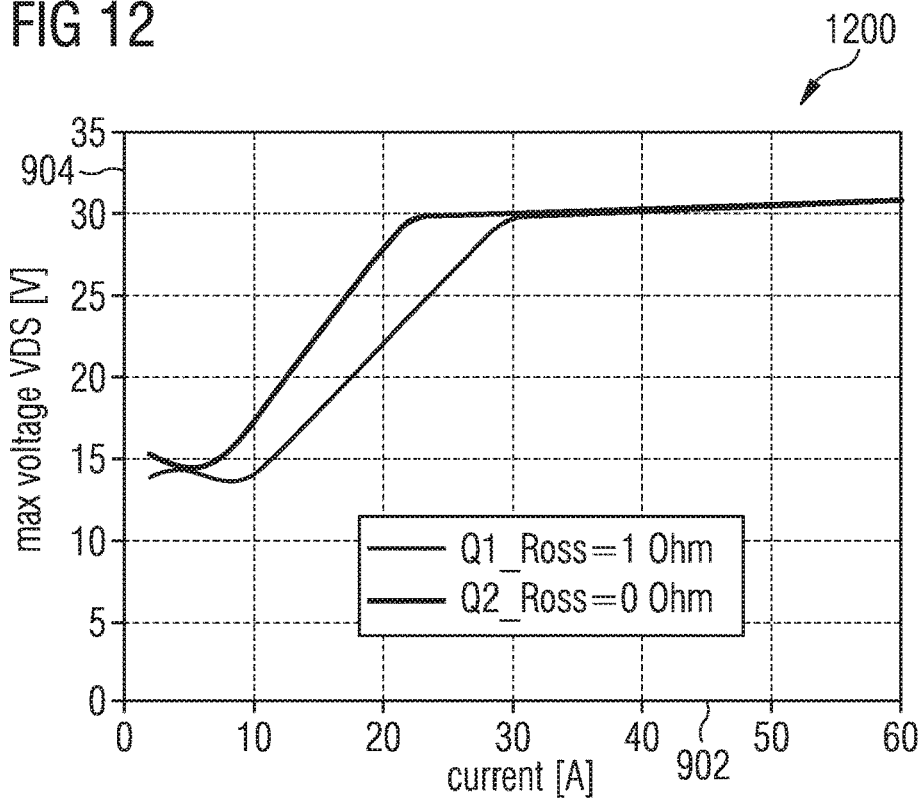
FIG. 12 is a diagram illustrating maximum voltage of different transistors of the half bridge according to FIG. 10 depending on current.

FIG. 12 is a diagram 1200 illustrating maximum voltage of different transistors of the half bridge according to FIG. 10 depending on current. Along an abscissa 902, the current is plotted. Along an ordinate 904, the maximum voltage is plotted.

FIG. 11 and. FIG. 12 show a reduction of the overshoot by putting resistor Ross_Q1 in series to a part of the output capacitance.

Figure 13:
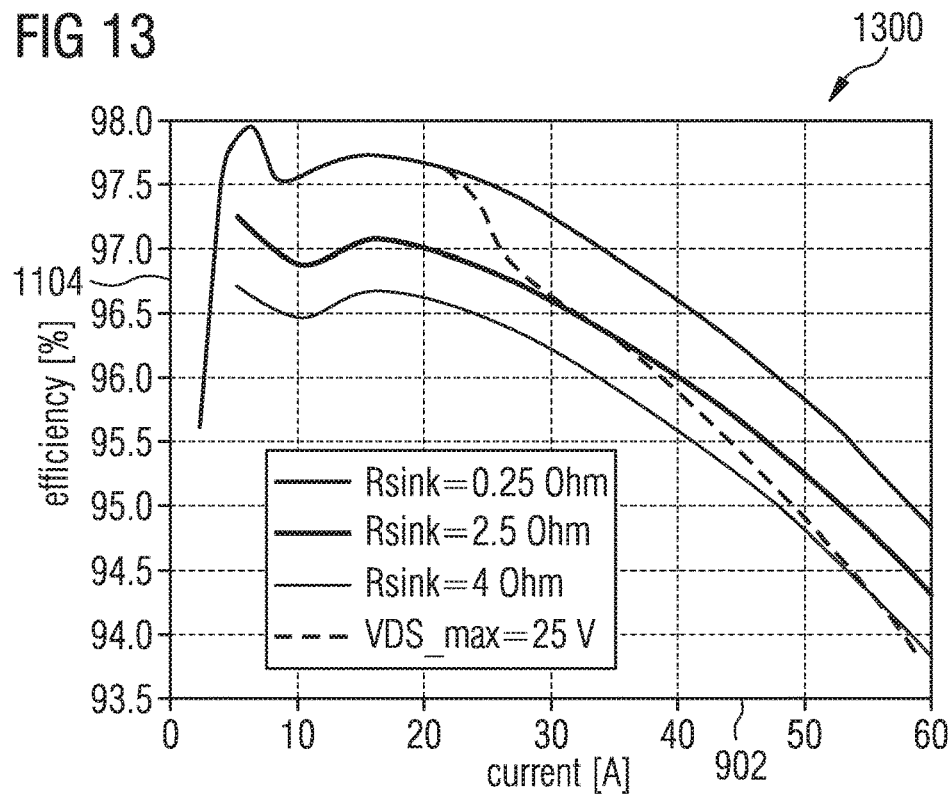
FIG. 13 is a diagram illustrating efficiency of the half bridge according to FIG. 10 depending on a current.

FIG. 13 is a diagram 1300 illustrating efficiency of the half bridge according to FIG. 10 depending on a current. Along an abscissa 902, the current is plotted. Along an ordinate 1104, the efficiency is plotted.

Figure 14:
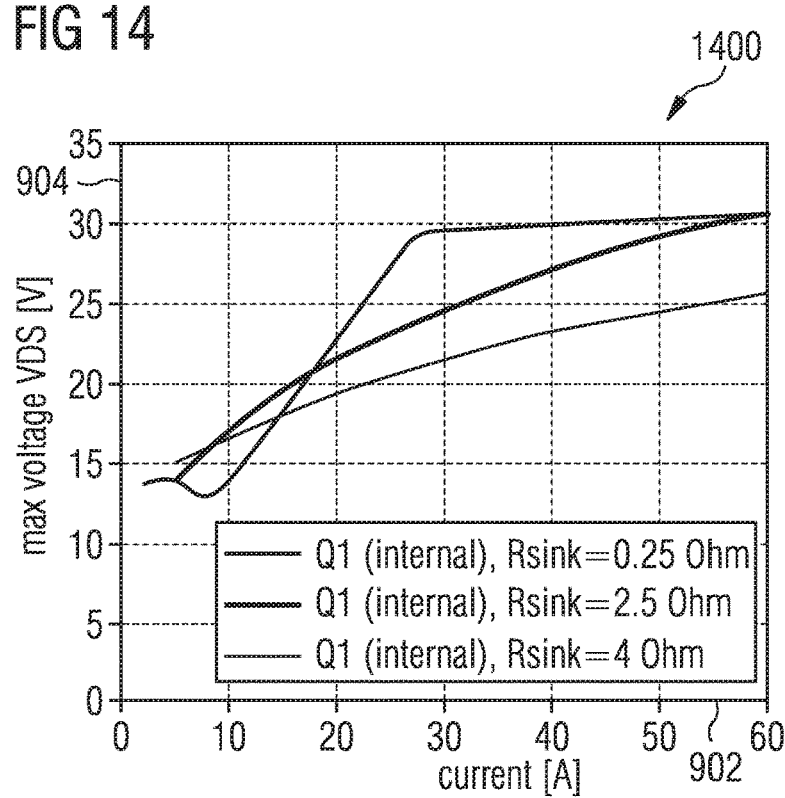
FIG. 14 is a diagram illustrating maximum voltage of the switch transistor of the half bridge according to FIG. 10 depending on current and in different configurations.

FIG. 14 is a diagram 1400 illustrating maximum voltage of the switch transistor of the half bridge according to FIG. 10 depending on current and in different configurations. Along an abscissa 902, the current is plotted. Along an ordinate 904, the maximum voltage is plotted.

A parallel path to the output capacitance may be formed by keeping the channel open to bypass some of the energy. In most cases, the gate drive strength is reduced, either in the driver itself, or by putting a gate resistor in series which may be integrated into the FET or the driver. This will prolong the time where the channel can conduct current. A shortcoming of this approach is that this significantly increases losses over the entire load range (see FIG. 13 and FIG. 14).

FIG. 13 and FIG. 14 show an increase of the resistance in the gate driver from 0.25 Ohm to higher values. The higher the resistance, the lower the voltage overshoots, but at the disadvantage of lower efficiency. The dashed line in FIG. 13 refers to an intelligent driver which adjusts the driver strength based on available current information (for instance from an integrated current sense structure), so it is representing the best possible solution to keep the voltage below the nominal 25V breakdown voltage of the FET.

Integration of a Zener diode adds some complexity but reduces voltage overshoot. A lower threshold voltage acts similar to the weaker gate drive.

Hence, there remains room for improvement in terms of reliability and efficiency of a half bridge circuit. In the following, corresponding improvements provided by exemplary embodiments of the invention will be described.

FIG. 1 illustrates a circuit diagram of a buck converter with a half bridge circuit 100 according to an exemplary embodiment.

The buck converter includes the half bridge circuit 100 shown in FIG. 1. The half bridge circuit 100 comprises an input connection 102 for supplying an electric voltage as electric input, more precisely an electric DC input voltage. This electric DC input voltage is to be converted into an electric DC output by the half bridge circuit 100, wherein the electric output has a larger current and a smaller voltage than the electric input. At an output connection 104, an output current as electric output is provided to a load (not shown) to be connected to the output connection 104. The load may be any electric circuit or electronic member consuming or using the electric output generated by the half bridge circuit 100.

A switch 106 and a diode 108 are connected between the input connection 102 and the output connection 104. Directly between the switch 106 and the diode 108, a voltage limiting inductance 110 is arranged. The voltage limiting inductance 110 is configured for limiting a voltage value which occurs upon switching the switch 106. In particular when the switch 106 is switched from an "on" state into an "off" state, an overshoot voltage may be generated which may conventionally exceed a breakthrough voltage of transistor Q1 constituting the switch 100. This may harm the half bridge circuit 100.

As mentioned, the switch 106 is configured as a transistor Q1 and can hence be denoted as field effect transistor switch. The diode 108 is configured as a further transistor Q2 and can hence be denoted as field effect transistor diode. The voltage limiting inductance 110 is arranged between a source 112 of the transistor switch 106 and a drain 114 of the transistor diode 108. Both the switch 106 and the diode 108 are connected within a loop 116 between the input connection 102 and the output connection 104. The voltage limiting inductance 110 has an inductance value being large enough so that the maximum voltage upon switching the switch 106 is limited to about 25 V. For this purpose, the voltage limiting inductance 110 is set to have an inductance value of about 100 pH. Preferably, the inductance value of the voltage limiting inductance 110 is at least 20% of a loop inductance 130 of the loop 116. Furthermore, an inductance value of a gate inductance 118 of the transistor switch 106 may be as small as 300 pH. As can be taken from FIG. 1, the voltage limiting inductance 110 is configured as an inductive feedback element configured for limiting a gate current of the switch 106 in the event of a rapidly changing electric current in the half bridge circuit 100.

As an alternative to the configuration shown in FIG. 1, the half bridge circuit 100 may be configured for selectively bypassing the voltage limiting inductance 110 upon determining that an electric current value in the half bridge circuit 100 is below a predefined threshold value, in particular is below 20 A. This has the advantage that the voltage limiting inductance 110, which slightly reduces the conversion efficiency of the half bridge circuit 100, may be switched inactive or may be deactivated under conditions in which it is not needed (for instance relatively small load current). This combines both a reliable protection against an overshoot voltage as well as an unnecessary reduction of the performance.

Although not shown in FIG. 1, it is possible that the half bridge circuit 100 of FIG. 1 furthermore comprises an energy dissipating ohmic resistor (see reference numeral 170 in FIG. 10) in series with the switch 106 arranged in a manner as shown in FIG. 10. Additionally or alternatively, the half bridge circuit 100 may comprise a charging suppressing ohmic resistor (see reference numeral 172 in FIG. 10) in parallel with the switch 106 arranged in a manner as shown FIG. 10. Any of these additional resistors 170, 172 may further reduce a voltage overshoot occurring upon switching the switch 106.

The input voltage of the half bridge circuit 100 is supplied via an input capacitance 140 (see also reference numeral C_IN). The gate terminal of the switch 106 is connected to a pad 142 labelled "GH" (gate high). A driver (see reference numeral 400 in FIG. 4) can be connected to pad 142. A further pad 144 labelled "phase" is electrically coupled with the voltage limiting inductance 110, the drain 114 of the diode 108 and an output inductance 146 (the latter serving for storing or buffering energy).

In order to keep a voltage overshoot during switching switch 106 "off" below the breakdown voltage of switch 106, or keeping the voltage overshot at diode 108 below the breakdown voltage of diode 108 during switching switch 106 "on", the half bridge circuit 100 according to FIG. 1 creates a feedback using source inductance.

In an embodiment, the loop inductance 130 (L_loop) is not a lumped element as shown in the circuit representation of FIG. 1 (alternatively, it may however be embodied as a lumped element). In contrast to this, it may be distributed over the entire loop 116 in the embodiment shown in FIG. 1. In particular, there is also an inductance contribution between Q1 and Q2, i.e. voltage limiting inductance 110, as shown in FIG. 1.

In case of a transient, there will be a voltage drop proportional to the change of the current I over time t (i.e. dI/dt) which may reduce or even stop the gate current flowing until the end of the commutation phase. If correspondingly designed, the channel will remain conductive at rather high VDS which still guarantees a fast turn-off.

For the given example, a value of the voltage limiting inductance 110 of 100 pH may keep the overshoot below 25 V (compare FIG. 3). The impact on conversion efficiency is significantly smaller (the reduction is only around 0.1%, compare FIG. 2) than with any other available solution (compare in particular the description of FIG. 10). Even the overshoot at transistor diode 108 (Q2) can be reduced from 21 V to about 18 V. (compare FIG. 3). This allows reducing the breakdown voltage of the FETs which in turn improves electrical parameters like on-state resistance.

FIG. 1 hence shows a half bridge circuit 100 with source inductance. For the shown embodiment, a value of the voltage limiting inductance 110 of around 100 pH can keep the overshoot below 25 V.

If the gate circuit is fast enough, the voltage settles at about:

$$VDS,\max = Vin + L\_loop/Ls\ V\_plateau$$

In the latter equation, Vin the input voltage provided at the input connection 102 and V_plateau is a plateau voltage.

For a 12V input conversion to lower output voltage using transistors with nominal breakdown voltage of 25V or 30V, the source inductance may be adjusted to be preferably around a quarter of the loop inductance. In a certain implementation, this corresponds to a value of the voltage limiting inductance 110 of about 100 pH.

The gate loop inductance 118 should be very low, as the half bridge circuit 100 needs to react within a short time of for instance less than 1 ns. Also a hybrid solution is possible, for instance the use of an integrated NMOS in Q1.

For further improved efficiency, it is even possible to bypass the source inductance (i.e. the voltage limiting inductance 110) for light to medium load (for instance by a separate tap or pad at a driver circuit). Furthermore, the value of the resistor Ross_Q1 of switch 106 may be reduced.

If a certain circuit design is incompatible with a necessary value of the source inductance Ls, a lower plateau voltage V_plateau, i.e. a lower threshold voltage, can be used.

FIG. 2 shows a diagram 250 illustrating efficiency of a conventional half bridge and of a half bridge 100 according to an exemplary embodiment depending on current. Along an abscissa 252, the current is plotted. Along an ordinate 254, the efficiency is plotted. Hence, FIG. 2 shows the efficiency impact for Ls=100 pH in comparison with no source feedback. As can be taken from FIG. 2, the efficiency reduction due to the provision of the voltage limiting inductance 110 with inductance value Ls=100 pH is extremely small.

FIG. 3 is a diagram 300 illustrating maximum voltage of the different transistors Q1, Q2 of half bridge 100 according to an exemplary embodiment depending on current. Along an abscissa 252, the current is plotted. Along an ordinate 302, the maximum voltage is plotted. FIG. 3 therefore shows overshoot at both FETs Q1 and Q2, i.e. at switch 106 as well as at diode 108. As can be taken from FIG. 3, the overshoot protection due to the provision of the voltage limiting inductance 110 with inductance value Ls=100 pH is remarkable.

Figure 4:
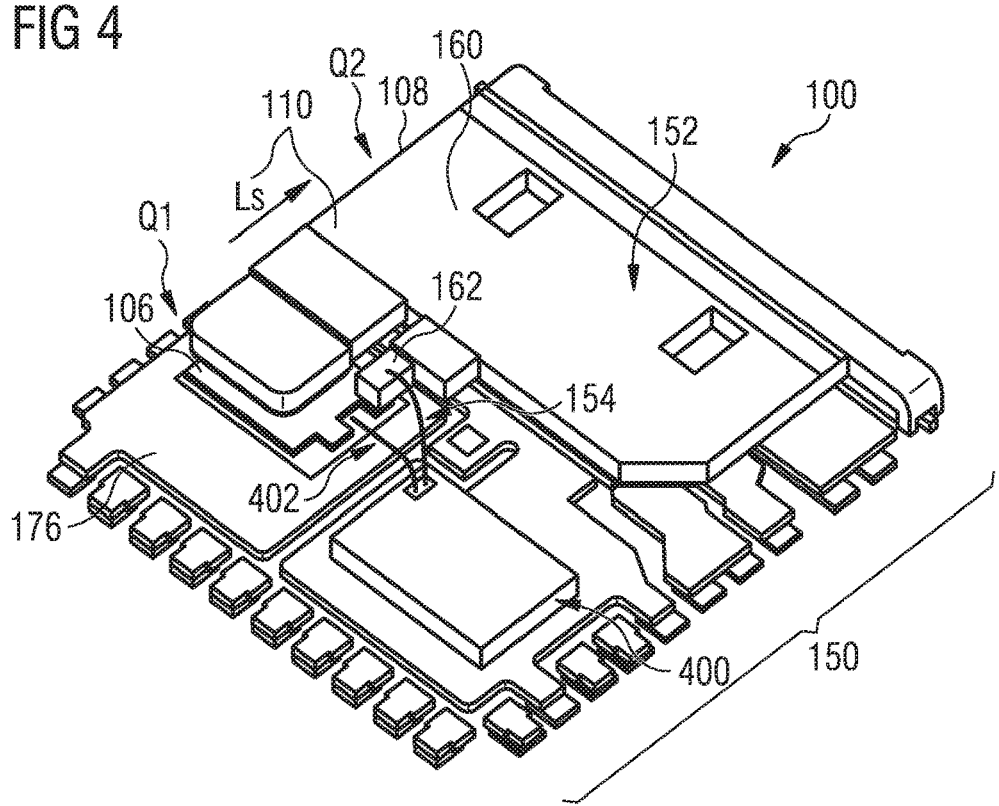
FIG. 4 illustrates a three-dimensional view of a package of a buck converter with a half bridge, involving a bond wire connected clip, according to an exemplary embodiment.

FIG. 4 illustrates a three-dimensional view of a package 150 of a buck converter with a half bridge circuit 100, involving a bond wire connected clip (see bond wire 154, clip 152), according to an exemplary embodiment. FIG. 4 is a simple design sketch showing a solution with source feedback.

Before describing the functionality of the package 150 in terms of the half bridge circuit 100 according to FIG. 1, a highly advantageous particularity of the package design according to FIG. 4 will be described. A person skilled in the art will understand that the described package design, in particular clip design, can be implemented advantageously in very different applications (for example also for a motor drive).

The semiconductor package 150 comprises a metallic clip 152 and a bond wire 154. The bond wire 154 is directly connected to the clip 152 by wire bonding.

Furthermore, the semiconductor package 150 comprises three semiconductor chips, i.e. transistor switch 106, transistor diode 108 (hardly visible in FIG. 4, since located below clip 152), and driver 400. The semiconductor chips relating to switch 106 and diode 108 are electrically coupled with the clip 152 by soldering. However, the semiconductor chip relating to driver 400 is electrically connected with the clip 152 indirectly via bond wire 154. In other words, bond wire 154 bridges a gap between the clip 152 and a pad of the driver 400, as shown in FIG. 4. More specifically, the clip 152 comprises a plate-type section 160 and a finger section 162 integrally formed with the plate-type section 160. The bond wire 154 is connected to the finger section 162 (carrying only a small gate charging current, however not a large load current). In contrast to this, the plate-type section 160 carries the large load current. The finger section 162 is not in contact with the source 112 of switch 106, i.e. is not at source potential. The load current flows substantially along plate-type section 160 bridging switch 106 and diode 108 (being embodied as separate chips).

The semiconductor chips (see reference numeral 106, 108, 400) are mounted on a carrier 176 (such as a lead frame). Also the clip 152 is mounted on the carrier 176 but vertically extends beyond the upper main surfaces of the semiconductor chips.

Conventional clips are made of copper material which is prone to oxidation. This is conventionally no problem. However, with the clip 152 according to the described exemplary embodiment of the invention, an electrically insulating oxide layer on top of the copper clip 152 needs to be removed before connecting the bond wire 154 thereon, to ensure a proper electric connection. Alternatively, at least the part of the surface of the clip 152 at which the bond wire 154 is to be connected is covered with a coating or plating which does not suffer from surface oxidation (for instance a plating with silver, gold, palladium, nickel, or nickel-phosphorous). This allows to obtain a reliable electric coupling with the described wire-on-clip architecture.

The bond wire 154 may for example comprise silver, aluminum, gold, or copper and may be shaped as a filament or a ribbon.

Coming back to the half bridge functionality of the package 150 of FIG. 4, the switch 106 and the diode 108 are separate semiconductor chips but belong to the common package 150 of FIG. 4.

As can be taken from FIG. 4, the clip 152 is configured for directly coupling the switch 106 with the diode 108. Highly advantageously, the voltage limiting inductance 110 is formed by the clip 152. This allows a flexible design and adaptation of the value of the voltage limiting inductance 110 by a correspondingly shaping and dimensioning of the clip 152. The half bridge circuit 100 further comprises the bond wire 154, which can also be denoted as gate return (phase) wire as it is coupled with pad 144 (phase), bridging together with the clip 152 the switch 106 and the diode 108 with regard to the driver 400. The plate-type section 160 is carrying a substantial part of a load current. The finger-type section 162 is integrally formed with and therefore electrically connected with the plate-type section 160, but does substantially not carry load current during operation. The clip 152 accomplishes a low ohmic connection between the mentioned electronic elements. FIG. 4 furthermore shows a further bond wire 402 which may be denoted as gate wire and is configured for providing a connection to pad 142 ("GH") and electrically bridging switch 106 and driver 400.

The wire-on-clip architecture according to FIG. 4 provides, at a low manufacturing and assembly effort, for an improved package performance based on an increased maximum clip size. In the shown application, it fulfills the task that the gate-IC can be directly connected to the clip 152. More generally, the described wire-on-clip architecture is in particular highly appropriate for all types of multi-chip-modules or packages. The wire-on-clip architecture is particularly powerful in combination with a special clip plating (for instance Ag, Au, Pd, Ni and/or NiP), as described above. It can be carried out with different wire materials (for instance Ag, Al, Au and/or Cu). Wire processes which may be carried out in connection with the wire-on-clip architecture include ball processing, wedge processing and/or a ribbon configuration. Such a wire-on-clip architecture can be universally used for many different applications such as DC/DC conversion, and motor drive. Based on such a wire-on-clip concept, the efficiency within DC/DC—or motor applications may be improved due to reduced or optimized package/board-loop-inductance.

In order to design a 100 pH voltage limiting inductance, an additional connection is possible to bring the drain potential of diode transistor Q2 (in FIG. 4 hidden by the clip 152, flipped) to the smaller highside switch transistor Q1. The clip 152 may be soldered to a dedicated pad, or can be only in mechanical contact with a passivated surface. The design of the package 150 according to FIG. 4 allows to obtain a sufficiently high value of the voltage limiting inductance 110.

FIG. 5 illustrates a plan view of a package 150 of a buck converter with a half bridge 100, involving a bond wire-connected clip 152, according to an exemplary embodiment.

FIG. 5 shows an exemplary realization of the above-described source inductance feedback. The voltage limiting inductance 110 is active for both the turn-on and the turn-off operation. The buck converter according to package 150 of FIG. 5 is hence configured so that, upon switching the switch 106 "on" and upon switching the switch 106 "off", the voltage limiting inductance 110 is always inside a current flow path.

For switching "on", the current path is from terminal "phase" via the connected bond wire 154 onto clip 152, from there to switch 106, further via bond wire 402 onto driver 400, and from there via a further bond wire 500 to terminal "boot". For switching "off", the current loop is formed by bond wire 402, a wire directly connecting the driver 400 to clip 152 and the clip connection to chip 106. This clip connection forms the required source inductance 110.

FIG. 6 illustrates a plan view of a package 150 of a buck converter with a half bridge 100, involving a bond wire connected clip 152, according to an exemplary embodiment.

In contrast to the package 150 according to FIG. 5, the package 150 according to FIG. 6 is configured so that, upon switching the switch 106 "on", the voltage limiting inductance 110 is outside a current flow path, and upon switching the switch 106 "off", the voltage limiting inductance 110 is inside the current flow path. Thus, FIG. 6 shows another realization of the source inductance feedback. The source inductance is active only for turn-off, not for turn-on. For switching "on" and switching "off", the current paths are different according to FIG. 6. For switching "on": from terminal "phase" via connected bond wire 600 onto switch 106, further via bond wire 402 onto driver 400, and from there via further bond wire 500 to terminal "boot". For switching "off": along a loop between switch 106, clip 152, bond wire 154 on driver 400, and bond wire 402.

Figure 15:
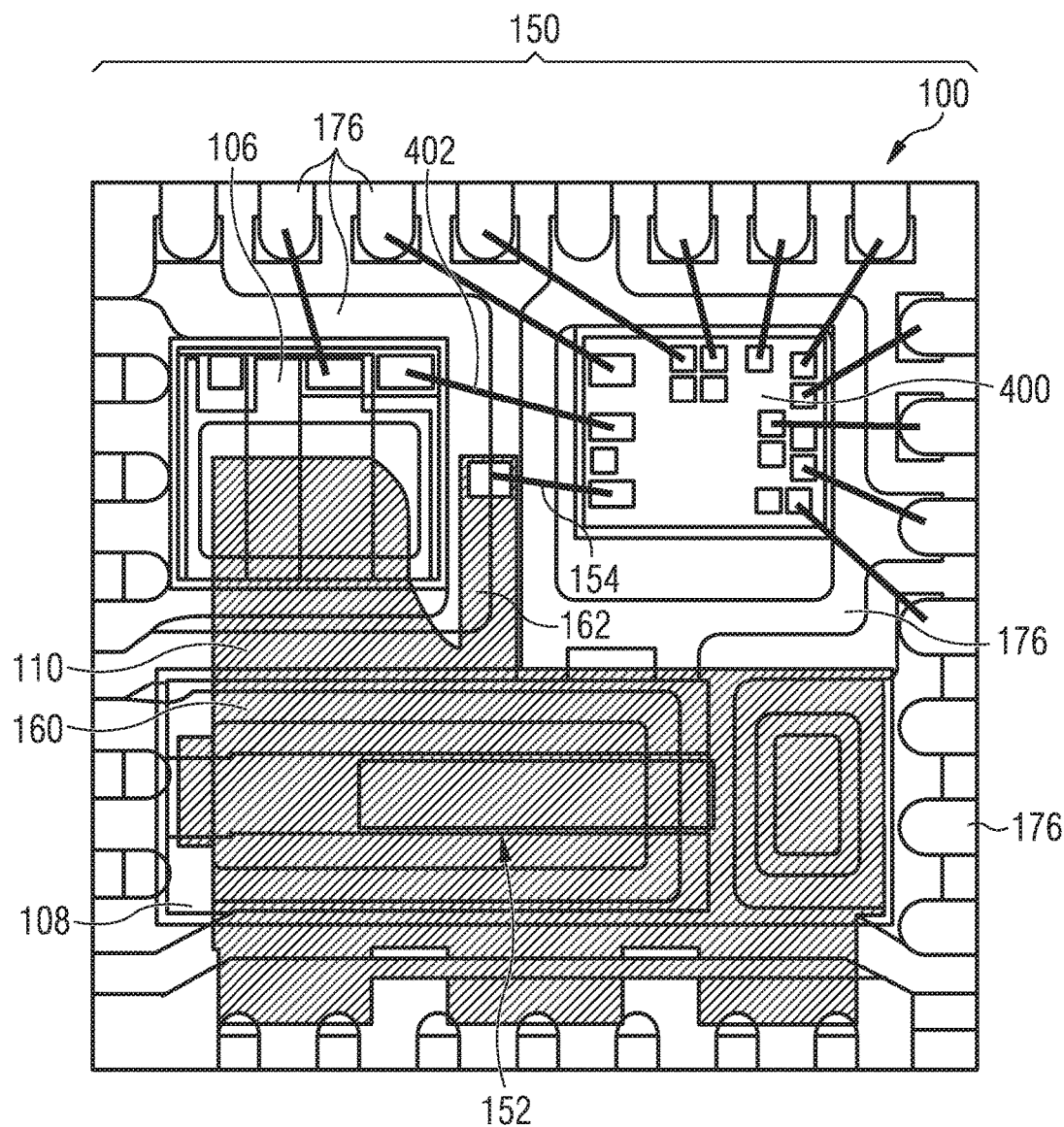
FIG. 15 illustrates a plan view of a package of a buck converter with a half bridge, involving a bond wire connected clip, according to an exemplary embodiment.

FIG. 15 illustrates a plan view of a package 150 of a buck converter with a half bridge 100, involving a bond wire connected clip 152, according to an exemplary embodiment.

According to FIG. 15, the finger section 162 is an overhanging structure. Such an overhanging structure may freely float in a cantilever fashion, or may be supported by a support element (not shown). Thus, the above-described wire-on-clip architecture can be combined with a special process flow (for instance the shown overhanging wire configuration).

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A half bridge circuit, comprising:
an input connection configured to supply an electric input;
an output connection configured to supply an electric output to a load to be connected to the output connection;
a switch and a diode arranged between the input connection and the output connection; and
a voltage limiting inductance arranged in series between the switch and the diode, the voltage limiting inductance configured to limit, upon switching the switch, a maximum voltage across the switch to below a breakdown voltage of the switch,
wherein the half bridge circuit is configured to bypass the voltage limiting inductance when the switch is switched from an off state to an on state and/or when an electric current value in the half bridge circuit is below a predefined threshold value.

2. The half bridge circuit of claim 1, wherein the switch is a field effect transistor switch, wherein the diode is a field effect transistor diode, and wherein the voltage limiting inductance is arranged in series between a source of the field effect transistor switch and a drain of the field effect transistor diode.

3. The half bridge circuit of claim 1, wherein both the switch and the diode are connected within a loop between the input connection and the output connection, and wherein the voltage limiting inductance has an inductance value in a range between 20% and 70% of a loop inductance of the loop.

4. The half bridge circuit of claim 3, wherein the voltage limiting inductance is distributed over the entire loop.

5. The half bridge circuit of claim 1, wherein the half bridge circuit is configured as a buck converter circuit.

6. The half bridge circuit of claim 1, further comprising a clip directly coupling the switch to the diode, wherein at least part of the clip forms at least part of the voltage limiting inductance.

7. The half bridge circuit of claim 6, wherein the switch is included in a first semiconductor chip, wherein the diode is included in a second semiconductor chip, and wherein the clip covers at least part of the first semiconductor chip and the second semiconductor chip.

8. The half bridge circuit of claim 6, further comprising at least one wire bridging a gap between the clip and a semiconductor chip that includes a driver.

9. The half bridge circuit of claim 6, wherein the clip comprises a first section configured to carry a load current and a second section electrically connected to the first section but not configured to carry the load current.

10. The half bridge circuit of claim 1, further comprising at least one of an energy dissipating ohmic resistor in series with the switch and a charging suppressing ohmic resistive path in parallel with the switch.

11. The half bridge circuit of claim 1, wherein upon switching the switch on, the voltage limiting inductance is outside a current flow path of the half bridge circuit, and wherein upon switching the switch off, the voltage limiting inductance is inside the current flow path.

12. The half bridge circuit of claim 1, wherein the voltage limiting inductance is configured as an inductive feedback element configured to limit a gate current of the switch in response to a rapidly changing electric current in the half bridge circuit.

13. The half bridge circuit of claim 1, wherein the voltage limiting inductance is a lumped element.

14. A method of operating a half bridge circuit, the method comprising:
supplying an electric input to an input connection of the half bridge circuit;

generating an electric output by a switch and a diode between the input connection and an output connection of the half bridge circuit to which a load is connected;

limiting, upon switching the switch, a maximum voltage across the switch to below a breakdown voltage of the switch by a voltage limiting inductance arranged in series between the switch and the diode; and bypassing the voltage limiting inductance when the switch is switched from an off state to an on state and/or when an electric current value in the half bridge circuit is below a predefined threshold value.

15. A half bridge circuit, comprising:

an input connection configured to supply an electric input;

an output connection configured to supply an electric output to a load to be connected to the output connection;

a switch and a diode arranged between the input connection and the output connection;

a voltage limiting inductance arranged in series between the switch and the diode, the voltage limiting inductance configured to limit, upon switching the switch, a maximum voltage across the switch to below a breakdown voltage of the switch;

a clip directly coupling the switch to the diode, wherein at least part of the clip forms at least part of the voltage limiting inductance; and at least one wire bridging a gap between the clip and a semiconductor chip that includes a driver.

16. A half bridge circuit, comprising:

an input connection configured to supply an electric input;

an output connection configured to supply an electric output to a load to be connected to the output connection;

a switch and a diode arranged between the input connection and the output connection;

a voltage limiting inductance arranged in series between the switch and the diode, the voltage limiting inductance configured to limit, upon switching the switch, a maximum voltage across the switch to below a breakdown voltage of the switch; and a clip directly coupling the switch to the diode, wherein at least part of the clip forms at least part of the voltage limiting inductance, wherein the clip comprises a first section configured to carry a load current and a second section electrically connected to the first section but not configured to carry the load current.

17. A half bridge circuit, comprising:

an input connection configured to supply an electric input;

an output connection configured to supply an electric output to a load to be connected to the output connection;

a switch and a diode arranged between the input connection and the output connection; and a voltage limiting inductance arranged in series between the switch and the diode, the voltage limiting inductance configured to limit, upon switching the switch, a maximum voltage across the switch to below a breakdown voltage of the switch, wherein upon switching the switch on, the voltage limiting inductance is outside a current flow path of the half bridge circuit, and wherein upon switching the switch off, the voltage limiting inductance is inside the current flow path.

* * * * *